United States Patent [19]

Aichelmann, Jr.

[11] 4,152,781
[45] May 1, 1979

[54] MULTIPLEXED AND INTERLACED CHARGE-COUPLED SERIAL-PARALLEL-SERIAL MEMORY DEVICE

[75] Inventor: Frederick J. Aichelmann, Jr., Hopewell Junction, N.Y.

[73] Assignee: International Business Machines Corporation, Armonk, N.Y.

[21] Appl. No.: 920,923

[22] Filed: Jun. 30, 1978

[51] Int. Cl.$^2$ .................. G11C 8/00; G11C 7/00; G11C 21/00
[52] U.S. Cl. .................. 365/239; 307/221 C; 365/77; 365/183; 365/219
[58] Field of Search .................. 365/77, 78, 183, 219, 365/239; 357/24; 307/221 C

[56] References Cited

U.S. PATENT DOCUMENTS

| 3,914,748 | 10/1975 | Barton et al. | 365/183 |
| 3,953,837 | 4/1976 | Cheek | 365/45 |

OTHER PUBLICATIONS

Altman, Charge-Coupled Devices move in on Memories and Analog Signal Processing, Electronics, 8/8/74, pp. 91–101.

Primary Examiner—Stuart N. Hecker
Attorney, Agent, or Firm—Martin G. Reiffin

[57] ABSTRACT

An interlaced charge-coupled serial-parallel-serial memory device unscrambles the scrambled bit sequence produced by conventional interlacing, so that the output serial data bit stream has the same original bit sequency as the input bit stream.

9 Claims, 12 Drawing Figures

MULTIPLEXED AND INTERLACED CHARGE-COUPLED SERIAL-PARALLEL-SERIAL MEMORY DEVICE

BACKGROUND OF THE INVENTION

1. Field of the Invention

This invention relates generally to interlaced serial-parallel-serial charge-coupled memory devices, and more particularly, to a novel arrangement which outputs the serial data bit stream in the same original sequence as the input bit stream.

2. Description of the Prior Art

Interlaced serial-parallel-serial memory devices for use in data processing system storage and communication signal processing are well-known in the art. Referring to the patents and publications listed below under the heading "References Cited By Applicant", Boyle and Smith [Refs. 1, 2, 3] originally disclosed the basic charge-coupled concept. Weimer [Ref. 4], Tompsett [Ref. 5] and Collins [Ref. 6] disclosed serial-parallel-serial arrangements.

In the serial-parallel-serial configuration, a data bit stream is injected into a serial input shift register from where it is transferred in parallel to a parallel storage section. The data can then be shifted in parallel through the parallel section, and then transferred in parallel to a serial output register, from where it is shifted out as a serial bit stream.

This serial-parallel-serial configuration had bit density limitations because charge-coupled devices require both transfer and storage sites. That is, in a two-phase serial shift register, the storage of one bit of information requires not only a storage site but also a transfer site so that bits are actually stored at one instant of time in only one-half of the available sites. For example, in a two-phase serial charge-coupled device with eight sites, only four bits can be stored. The parallel section was similarly limited in that the channel width was necessarily twice the width of a single site in the serial sections so that only one-half of the potentially available storage sites in the parallel section could be utilized.

Bit storage density was then significantly improved by the interlaced modification of the serial-parallel-serial configuration. In an interlaced version of the above example having eight sites and two-phase operation, all eight serial bits can be transferred in parallel through the parallel section, at least theoretically doubling the number of bits that can be stored in the parallel section. Embodiments of interlaced configurations are disclosed by Elmer et al. [Ref. 10, 11, 12], Kosonocky [Ref. 8, 9], and Erb [Ref. 7].

However, the interlaced configuration of the prior art had the serious disadvantage that the data bits were scrambled upon transfer from the serial input register into the first row of the parallel section. That is, the data bits were put in a sequential order different from the original order of the input bit stream. It was then necessary to provide additional circuitry to unscramble the bits and put them back into the original sequential order. This additional circuitry substantially increased the complexity and cost of the interlaced devices.

SUMMARY OF THE INVENTION

It is therefore a primary object of the present invention to provide a novel interlaced serial-parallel-serial configuration which outputs the data bits in the same sequential order as the original order of the input bit stream.

A further object is to provide this unscrambled output bit stream by means of circuitry which is less complex and less expensive than the unscrambling schemes of the prior art.

In the preferred embodiment disclosed for purposes of illustrating one of the many forms which the invention may take in practice, these objects are achieved by a novel combination of two serial-parallel-serial loops. The alternate odd bits of a first record of the input bit stream are interlaced with the alternate even bits of another record of the input stream and these interlaced bits are stored in the first serial-parallel-serial loop. Similarly, the alternate even bits of the first record are interlaced with the alternate odd bits of the other record and these interlaced bits are stored in the second serial-parallel-serial loop. By properly timed clock signals the interlaced bits may then be alternately transferred out of the serial-parallel-serial loops in the same original sequence as the input bit stream.

IN THE DRAWINGS

FIGS. 1 to 6 inclusive illustrate the problem of scrambled data bits inherent in the interlaced serial-parallel-serial configurations of the prior art.

DETAILED DESCRIPTION

Referring first to FIGS. 1 to 6 inclusive, there is shown the scrambled data bit effect produced by conventional interlaced serial-parallel-serial configurations in accordance with the prior art, in order to illustrate the problem obviated by the present invention. In each of these figures the serial input register section is indicated at S and the parallel section is indicated at P. Only the first two rows of the parallel section P are shown. For simplicity and clarity in illustration, the serial input section S is shown as having only eight charge packet storage sites, and the parallel section is shown as having only eight columns each associated with a respective one of the serial section sites. It will be understood that in a production embodiment both sections may have many more sites and columns, respectively.

Figure 1:
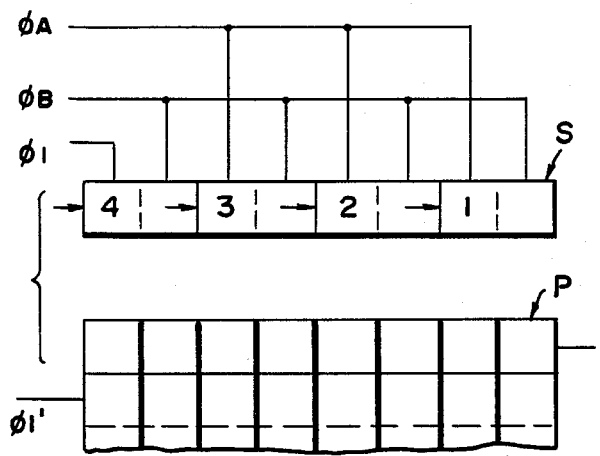

Referring to FIG. 1, the first four data bits of a serial bit stream are designated 1 to 4 respectively and are shifted serially into the serial input section S as shown. Each bit is transferred to the first storage site by the input clock signal $\phi 1$. The serial transfer of the charge packets corresponding to the respective bits is achieved by conventional clock signals φA and φB. It will be understood that the clock signals φA, φB, φ1, φ1', φ2' shown in FIG. 1 are also operative in FIGS. 2 to 6 inclusive, although not shown to avoid unnecessary duplication.

Figure 2:
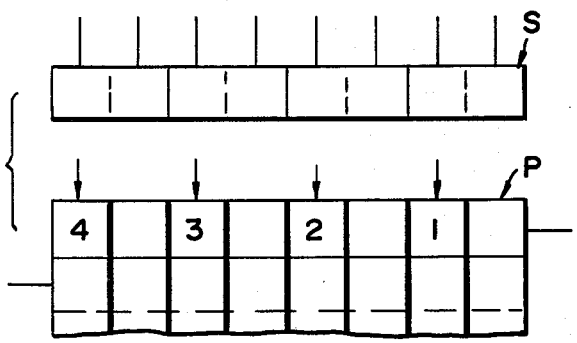

As viewed in FIG. 2, the clock signal φ2' causes the four charge packets corresponding to the first four data bits 1, 2, 3, 4 to be transferred simultaneously in parallel into the first row of the parallel section P. It will be seen that the charge packets corresponding to the first four data bits occupy alternate charge storage sites in the first row of the parallel section P.

Figure 4:
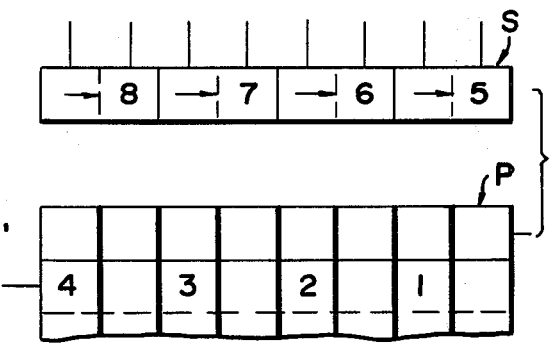
Figure 3:
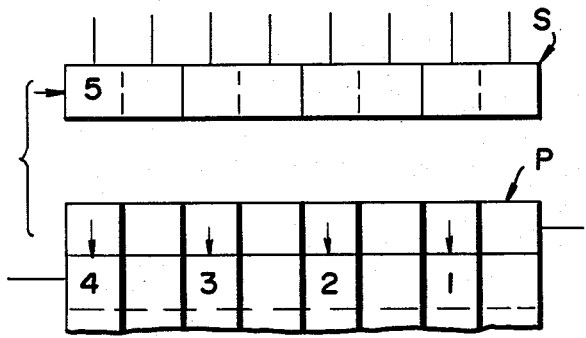

Referring now to FIG. 3, the first four data bits 1, 2, 3, 4 have been transferred by clock signal φ1' into the second row of the parallel section P while the charge packet corresponding to the fifth data bit designated at 5 has been shifted into the first charge storage site of the serial input section S. Referring now to FIG. 4 the second group of four bits designated as 5, 6, 7, 8 have been shifted serially into serial input section S by the clock signals φA and φB. It will be seen that these bits 5, 6, 7, 8 occupy the alternate charge storage sites which were not occupied by the first group of bits 1, 2, 3, 4.

Figure 5:
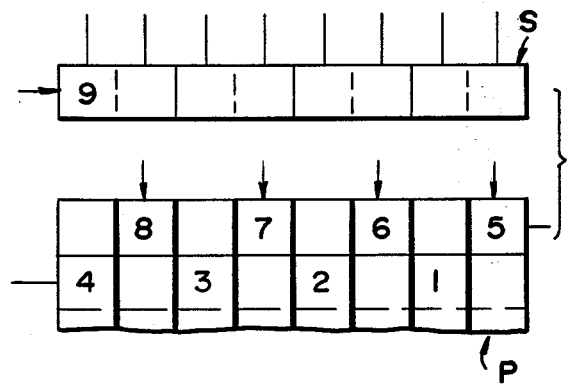
Figure 6:
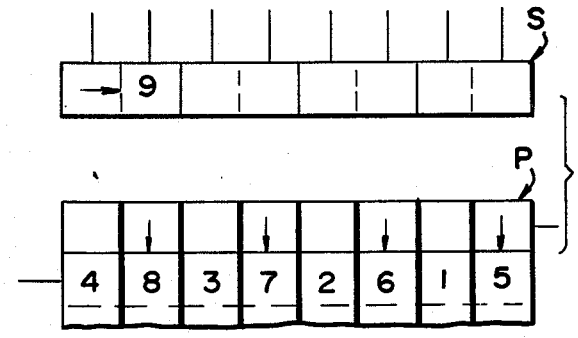

In FIG. 5 the second group of four data bits 5, 6, 7, 8 have been shifted by clock signal φ2' from the serial input section S into the first row of the parallel section P, while simultaneously the ninth data bit has been input into the first charge storage site of serial section S. In FIG. 6 the clock signal φ1' has transferred the second group of data bits 5, 6, 7, 8 from the first row of parallel section P into the second row.

It will be seen that the first group of data bits 1, 2, 3, 4 and the second group of data bits 5, 6, 7, 8 are now interlaced in the second row of parallel section P and that the bit sequence has been scrambled so as to differ from the original sequence. In accordance with the prior art, this scrambled bit sequence in the order 5, 1, 6, 2, 7, 3, 8, 4 was then transmitted in parallel from row to row of the parallel section P and was then unscrambled upon output from the last row of the latter. As heretofore practiced in the prior art, this unscrambling function has required additional logic circuitry which is complex and expensive.

Figure 7:
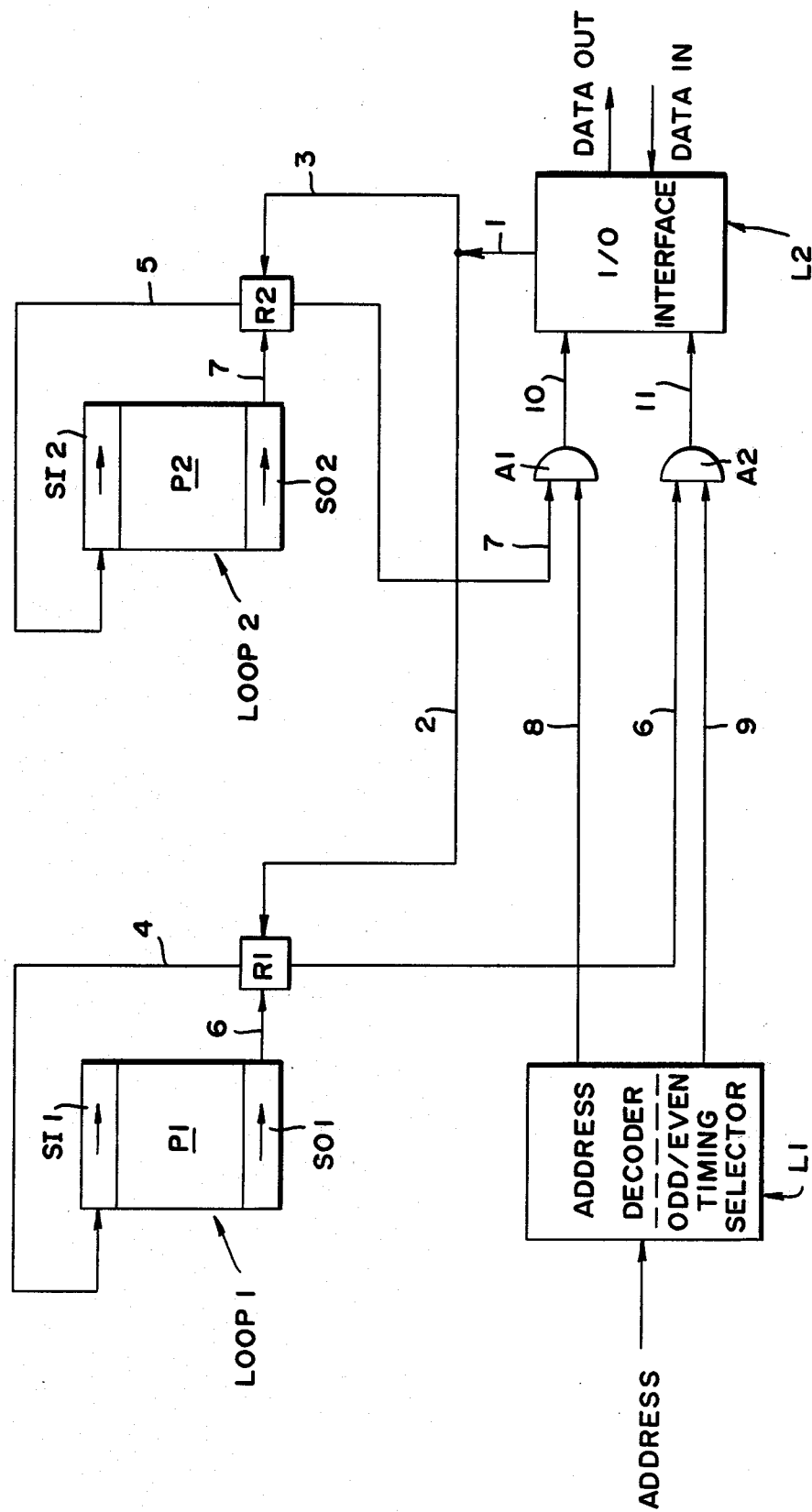
FIG. 7 shows a pair of serial-parallel-serial loops and associated control logic in accordance with the present invention.

Referring now to FIG. 7, there is shown a preferred embodiment of the invention. A first serial-parallel-serial configuration LOOP 1 comprises a serial input section SI1, a parallel section P1, a serial output section SO1, and a regenerator R1. A line 4 extends from regenerator R1 to the input of serial input Section SI1. A line 6 extends from the output of serial output section SO1 to regenerator R1.

A second serial-parallel-serial configuration LOOP 2 comprises a serial input section SI2, a parallel section P2, a serial output section SO2, and a regenerator R2. A line 5 extends from regenerator R2 to the input of serial input section SI2. A line 7 extends from the output of serial output section SO2 to the regenerator R2.

Data is input and output from the configuration by means of a conventional input/output interface L2 having an input port DATA IN and an output port DATA OUT. Lines 1, 2, extend from the input/output interface L2 to regenerator R1, and lines 1, 3 similarly extend to regenerator R2.

The address decoding logic and the logic for LOOP timing and selection of the alternate odd and even bits of the respective data records are symbolically designated by a logic block L1 having an input port address for address selection. A line 8 extends from the address decoder logic L1 to a first AND gate A1, and a second line 9 extends to a second AND gate A2. The other input of AND gate A1 is connected to a line 7 extending from regenerator R2, and the other input of AND gate A2 is connected to a line 6 extending from regenerator R1.

It will be understood that the logic for data regeneration, address decoding, LOOP bit selection and timing, and input/output interfacing has been subdivided into the four logic block symbols R1, R2, L1, L2, shown in FIG. 7 for purposes of clarity in illustration, and that in actual practice the circuitry for performing these logic functions is intimately interconnected rather than disassociated into separate discrete logic blocks as shown in the drawing. Furthermore, this circuitry is conventional and well-known in the art and the details thereof form no part of the present invention. In order to illustrate one of the many forms which circuitry of this type may take in practice, FIG. 8 shows a typical conventional arrangement for controlling the input, output, read and write operations of serial-parallel-serial configurations.

Figure 8:
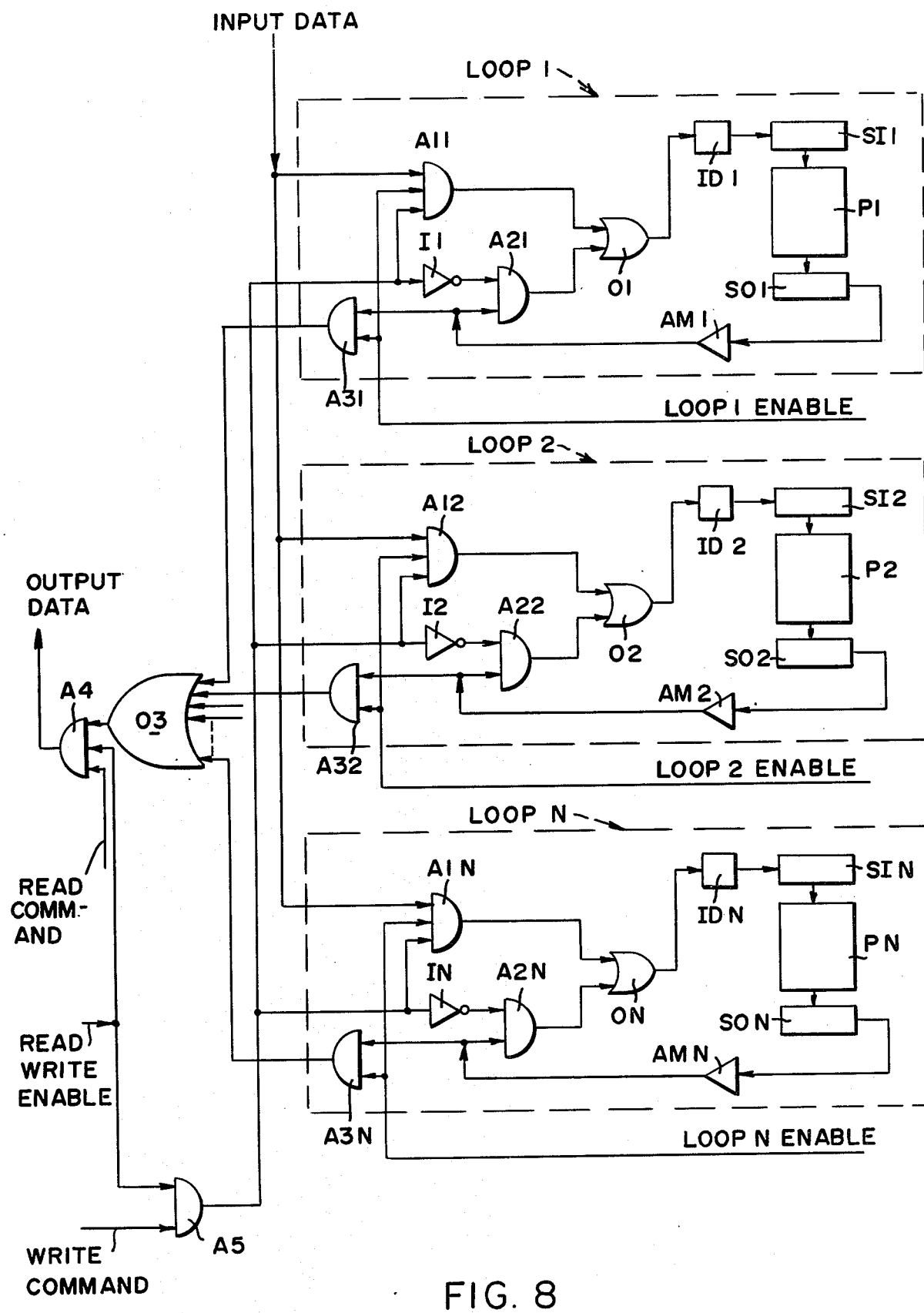
FIG. 8 shows details of the conventional control logic indicated symbolically in FIG. 7.

For simplicity and clarity in illustration, there are shown in FIG. 8 only three serial-parallel-serial configurations designated respectively as LOOP 1, LOOP 2, and LOOP N. The three loops shown are identical and have applied thereto the same reference numerals with the suffix "1" applied to LOOP 1, the suffix "2" applied to LOOP 2, and the suffix "N" applied to LOOP N. Therefore only LOOP 1 will be described in detail.

LOOP 1 comprises a serial input register section SI1, a parallel section P1 and a serial output register section SO1. Associated with LOOP 1 are logic gates including three AND gates A11, A21, A31, an OR gate O1, an inverter I1, an input device ID1, and an amplifier AM1. Each of these logic elements is conventional.

The input data is applied where indicated by the legend in the drawing and is transmitted to one input of each of the AND gates A11, A12, A1N. The second input of AND gate A11 has applied thereto an enable signal designated LOOP 1 ENABLE. Similarly, each second input of AND gates A12 and A1N have applied thereto enable signals respectively designated in the drawing. The third input of each of the AND gates A11, A12, A1N has applied thereto the output signal of AND gate A5. One of the inputs of the latter receives the WRITE COMMAND signal and its other input receives the READ WRITE ENABLE signal.

The output signal of AND gate A5 is also transmitted to the inputs of the respective inverters I1, I2, IN. The outputs of the latter are transmitted to the respective AND gates A21, A22, A2N. The outputs of the latter are transmitted to the respective inputs of OR gates O1, O2, ON. The outputs of the latter are in turn transmitted to the respective input devices ID1, ID2, IDN.

The outputs of the serial output register sections SO1, SO2, SON are transmitted to the respective inputs of amplifiers AM1, AM2, AMN. The outputs of the latter are transmitted to the respective AND gates A21, A22, A2N. The outputs of amplifiers AM1, AM2, AMN are also transmitted to the inputs of the respective AND gates A31, A32, A3N. The LOOP ENABLE signals are also transmitted to the latter gates. The outputs of AND gates A31, A32, A3N are transmitted to the respective inputs of OR gate O3 having its output transmitted to one of the inputs of AND gate A4. The second input of the latter has applied thereto the READ WRITE EN- ABLE signal, and its third input has applied thereto the READ COMMAND signal. The output of AND gate A4 provides the OUTPUT DATA signal.

OPERATION

The operation of the present invention will now be described with reference to FIGS. 7 and 9 through 12 inclusive. The serial data bit stream is transmitted to the DATA IN port of I/O INTERFACE L2. For simplicity and clarity in illustration, it will be assumed that this serial input stream comprises a sequence of data records each consisting of a train of eight bits. The two loop configurations LOOP 1 and LOOP 2 shown in FIG. 7 function to store two such data records. These records are generally not contiguously located in the input data bit stream. The bits of the first record will be designated as A1 through A8, and the bits of the second record will be designated as X1 through X8.

By clock signals applied to the control logic circuitry, the alternate odd bits A1, A3, A5, A7 are transmitted from the I/O INTERFACE L2 along lines 1, 2 to the regenerator R1 and then by line 4 to the serial input section SI1 of LOOP 1. In a similar manner, the alternate even bits X2, X4, X6, X8 of the data bit stream are transmitted to the serial input section SI1 of LOOP 1 and are interlaced in said serial input section with the previously transmitted alternate odd bits A1, A3, A5, A7 of the first record, to provide in the serial input secton SI1 of the first loop the bit sequence shown in FIG. 9. This row of bits is then transmitted in parallel through parallel section P1 of LOOP 1 in the conventional manner.

The alternate even bits A2, A4, A6, A8 of the first record of the serial data bit stream are transmitted by timed clock signals from I/O INTERFACE L2 through lines 1, 3, regenerator R2 and line 5 to the serial input section SI2 of LOOP 2. In a similar manner the alternate odd bits X1, X3, X5, X7 of the second record are transmitted to said serial input section SI2 of LOOP 2 and are interlaced with the even bits A2, A4, A6, A8 previously transmitted so as to provide in serial SI2 the bit sequence shown in FIG. 10. This row of bits is then transmitted in parallel through parallel section P2 of LOOP 2 in the conventional manner.

Figure 9:
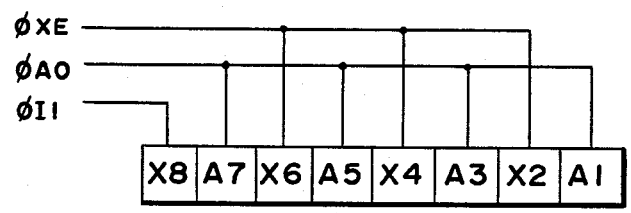
FIG. 9 shows the data bit sequence in the serial input section of the first loop in accordance with the present invention wherein the alternate odd bits of a first record are interlaced with the alternate even bits of a second record.
Figure 10:
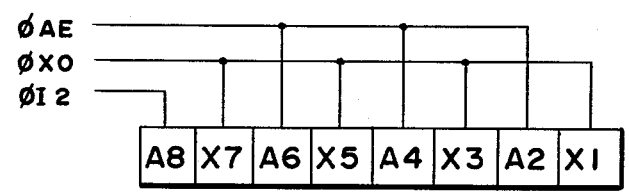
FIG. 10 is similar to FIG. 9 but shows the bit sequence of the serial input section of the second loop wherein the alternate even bits of the first record are interlaced with the alternate odd bits of the second record.

The row of bits shown in FIG. 9 eventually reaches the serial output register section SO1 of LOOP 1, and the row of bits shown in FIG. 10 eventually reaches the serial output register section SO2 of LOOP 2. The row shown in FIG. 9 may then be either regenerated by regenerator R1 and transmitted back through line 4 to the input of serial input section SI1, or instead may be transmitted through line 6 and AND gate A2 to the I/O INTERFACE L2 for output at the DATA OUT port. Similarly, the row of data bits shown in FIG. 10 eventually reaches serial output register section SO2 and then may either be regenerated in regenerator R2 and transmitted back through line 5 to the serial input register section SI2, or alternatively may be transmitted through line 7 to AND gate A1 for output at the DATA OUT port.

Figure 11:
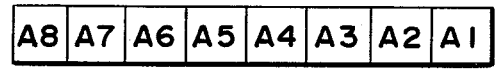
FIG. 11 shows the original and final data bit sequence of a first record.
Figure 12:
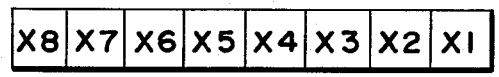
FIG. 12 shows the original and final data bit sequence of another record which is interlaced with the first record in the two loops.

By appropriately timing the clock signals the sequential order of the bits transmitted at the DATA OUT port may be readily selected so as to output the bits of the first record in their original sequence as shown in FIG. 11 and the bits of the second record in their original sequence as shown in FIG. 12. The address decoders odd/even timing and LOOP selector logic indicated symbolically at L1 provides suitable timing signals to AND gates A1, A2 so as to gate the I/O INTERFACE at L2 at the proper instant and to output the bits of the respective records in their original sequence shown in FIGS. 11 and 12, or in any other arbitrary sequence as may be desired.

While the invention has been shown and particularly described with reference to a preferred embodiment, it will be understood by those skilled in the art that various changes in form and detail may be made therein without departing from the scope of the invention which is delineated in the appended claims.

REFERENCES CITED BY APPLICANT

1. Boyle, W. S. and Smith G. E., "Charge Coupled Semiconductor Devices," Bell Sys. Tech. J. (April 1970) pp. 587–593.
2. Boyle, W. S. and Smith, G. E., U.S. Pat. No. 3,858,232; issued Dec. 31, 1974; filed Nov. 9, 1971.
3. Smith, G. E., U.S. Pat. No. 3,761,744; issued Sept. 25, 1973; filed Dec. 2, 1971.
4. Weimer, P. K., U.S. Pat. No. 3,763,480; issued Oct. 2, 1973; filed Oct. 12, 1971.
5. Tompsett, M. F., "Charge Transfer Devices," J. Vac. Sci. Technol., Vol. 9, No. 4, (July-August 1972) pp. 1166–1181.
6. Collins, D. R., Barton, J. B., Buss, D. C., Kmetz, A. R., and Schroeder, J. E., "CCD Memory Options," 1973 IEEE International Solid-State Circuits Conference, (February 1973) pp. 136–137, 210.
7. Erb, D. M., U.S. Pat. No. 3,913,077; issued Oct. 14, 1975; filed Apr. 17, 1974.
8. Carnes, J. E. and Kosonocky, W. F., "Charge-Coupled Devices and Applications," Solid State Technology, (April 1974) pp. 67–77.
9. Kosonocky, W. F. and Sauer, D. J., U.S. Pat. No. 3,967,254; issued June 29, 1976; filed Nov. 18, 1974.
10. Elmer, B. R., Tchon, W. E., Denboer, A. J., Frommer, R., Kohyama, S. and Hirabayashi, K. "Fault Tolerant 92160 Bit Multiphase CCD Memory," IEEE International Solid-State Circuits Conference (February 1977) pp. 116–117.
11. Elmer, B. R., U.S. Pat. No. 4,024,509; issued May 17, 1977; filed June 30, 1975.
12. Elmer, B. R. and Tchon, W. E., U.S. Pat. No. 3,986,179; issued Oct. 12, 1976; filed June 30, 1975.

What is claimed is:

1. A charge-coupled memory device comprising
a first serial-parallel-serial loop including a first serial input section, a first parallel section and a first serial output section,
a second serial-parallel-serial loop including a second serial input section, a second parallel section and a second serial output section,
input means for receiving a serial data bit stream including a first record comprising a first serial train of bits and a second record comprising a second serial train of bits,
first clocking means for transmitting the alternate odd bits of said first record to said first serial input section,
second clocking means for transmitting the alternate even bits of said first record to said second serial input section,
third clocking means for transmitting the alternate even bits of said second record to said first serial input section, fourth clocking means for transmitting the alternate odd bits of said second record to said second serial input section, means for converting said bits into charge packets, and means for transferring the respective charge packets through said first and second serial input sections, then through said first and second parallel sections and then through said first and second serial output sections.

2. A charge-coupled memory device as recited in claim 1 and comprising output means, means transmitting said bits from said serial output sections to said output means, said output means including fifth clocking means for transmitting said bits of said first record in the same sequential order as said first serial train and for transmitting said bits of said second record in the same sequential order as said second serial train.

3. A charge-coupled memory device as recited in claim 1 wherein said first and second clocking means include means for interlacing in said first parallel section said odd bits of the first record with said even bits of the second record, and said third and fourth clocking means include means for interlacing in said second parallel section said even bits of the first record with said odd bits of the second record.

4. A charge-coupled memory device as recited in claim 1 and comprising output means, means transmitting said bits from said serial output sections to said output means, said output means including fifth clocking means for transmitting said bits of said first record in the same sequential order as said first serial train and for transmitting said bits of said second record in the same sequential order as said second serial train, said first and second clocking means including means for interlacing in said first parallel section said odd bits of the first record with said even bits of the second record, and said third and fourth clocking means including means for interlacing in said second parallel section said even bits of the first record with said odd bits of the second record.

5. A charge-coupled memory device comprising a plurality of serial-parallel-serial loops each including a serial input section, a parallel section and a serial output section, input means for receiving a serial data bit stream including a plurality of records each comprising a serial train of bits having an original predetermined sequential order, means for transmitting a first set of bits of one record to one of said serial input sections, means for transmitting a second set of bits of said one record to another of said serial input sections, means for transmitting a first set of bits of another record to said another serial input section, means for transmitting a second set of bits of said another record to said one serial input section, means for converting said bits into charge packets, and means for transferring the respective charge packets through said serial input sections, then through said parallel sections and then through said serial output sections.

6. A charge-coupled memory device as recited in claim 5 and comprising output means, means transmitting said bits from said serial output sections to said output means, said output means including means for transmitting said bits of said one record in the same sequential order as the original predetermined order thereof and for transmitting said bits of said another record in the same sequential order as the original predetermined order thereof.

7. A charge-coupled memory device as recited in claim 5 wherein said transmitting means include means for interlacing in one of said parallel sections said first set of bits of said one record with said second set of bits of said another record, and said transmitting means include means for interlacing in said another parallel section said second set of bits of said one record with said first set of bits of said another record.

8. A charge-coupled memory device as recited in claim 5 and comprising output means, means transmitting said bits from said serial output sections to said output means, said output means including means for transmitting said bits of said first record in the same sequential order as the original predetermined order thereof and for transmitting said bits of said another record in the same sequential order as the original predetermined order thereof, said transmitting means including means for interlacing in one of said parallel sections said first set of bits of said one record with said second set of bits of said another record, and said transmitting means including means for interlacing in said another parallel section said second set of bits of said one record with said first set of bits of said another record.

9. A charge-coupled memory device comprising a first serial-parallel-serial loop, a second serial-parallel-serial loop, input means for receiving a serial data bit stream including one record comprising one serial train of bits and a different record comprising a different serial train of bits, clocking means for transmitting the alternate odd bits of said one record to said first loop and for transmitting the alternate even bits of said one record to said second loop, clocking means for transmitting the alternate even bits of said different record to said first loop and for transmitting the alternate odd bits of said different record to said second loop, said clocking means including means for interlacing in said first loop said odd bits of said one record with said even bits of said different record, said clocking means including means for interlacing in said second loop said even bits of said one record with said odd bits of said different record, output means, means transmitting said bits from said loops to said output means, said output means including clocking means for transmitting said bits of said one record in the same sequential order as said one serial train and for transmitting said bits of said different record in the same sequential order as said different serial train.

* * * * *